United States Patent [19]

Namae et al.

[11] 4,214,163
[45] Jul. 22, 1980

[54] METHOD AND APPARATUS FOR CORRECTING ASTIGMATISM IN A SCANNING ELECTRON MICROSCOPE OR THE LIKE

[75] Inventors: Takao Namae; Teruo Someya, both of Akishimashi, Japan

[73] Assignee: Nihon Denshi Kabushiki Kaisha, Tokyo, Japan

[21] Appl. No.: 970,860

[22] Filed: Dec. 18, 1978

[30] Foreign Application Priority Data

Dec. 29, 1977 [JP] Japan .................. 52-157790

[51] Int. Cl.² ....................................... G01M 23/00
[52] U.S. Cl. ........................... 250/311; 250/396 ML
[58] Field of Search .................... 250/311, 396 ML

[56] References Cited

U.S. PATENT DOCUMENTS

| | | | |
|---|---|---|---|
| 3,597,609 | 8/1971 | Anger | 250/311 |
| 3,748,467 | 7/1973 | Suganuma | 250/311 |

*Primary Examiner*—Harold A. Dixon
*Attorney, Agent, or Firm*—Webb, Burden, Robinson & Webb

[57] ABSTRACT

In a scanning electron microscope, a circle of least confusion of the electron beam is formed on a specimen without operation of a stigmator, then the circle of least confusion is minimized by a stigmator, thereby enabling lens astigmatism in said microscope to be fully corrected.

7 Claims, 7 Drawing Figures

METHOD AND APPARATUS FOR CORRECTING ASTIGMATISM IN A SCANNING ELECTRON MICROSCOPE OR THE LIKE

BACKGROUND

This invention relates to a method and apparatus for correcrting astigmatism in a scanning electron microscope (SEM), or similar electron beam scanning device.

In an apparatus for obtaining a scanning image such as an SEM. etc., astigmatism correction of the electron optical system (principally the electron magnetic lenses), in order to finely focus the electron beam irradiating the specimen being examined, is an extremely important but quite difficult operation. Hitherto, the operator had to correct astigmatism by alternately adjusting the focus and astigmatism correction knobs while observing the scanning image on a Braun tube, an operation requiring considerable skill to obtain effective results.

The main object of the present invention is to provide a method and apparatus for carrying out astigmatism correction automatically, and thereby enhance the operability of the SEM.

SUMMARY OF THE INVENTION

Briefly, according to this invention, the electron beam scanning device is provided with an automatic focusing means, as described in U.S. Pat. No. 3,937,959, for focusing the electron beam on a specimen, a scanning means, and an astigmator. Firstly, the automatic focusing means and the scanning means are activated to form a circle of least confusion of the electron beam on the specimen without operation of the stigmator, and then the stigmator is brought into operation so as to minimize said circle of least confusion, and thereby enable lens astigmatism in said device to be fully corrected.

DRAWINGS

DETAILED DESCRIPTION OF THE INVENTION

Figure 1:
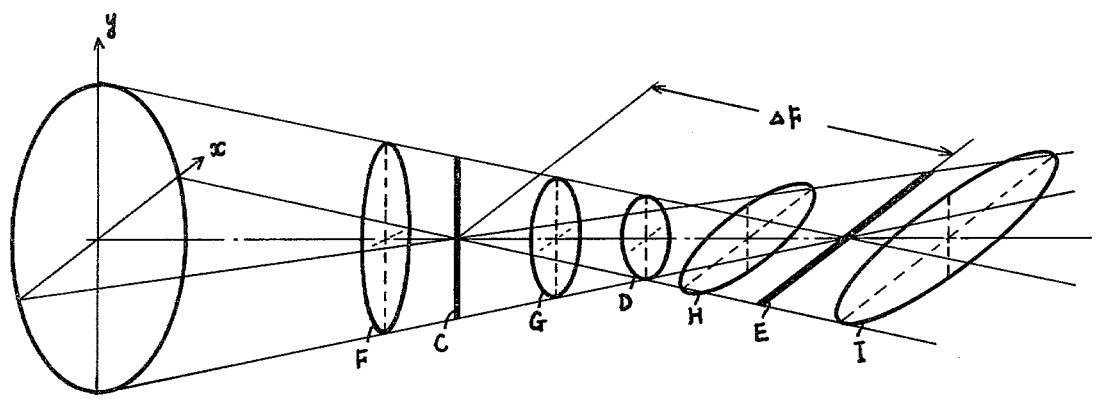
FIG. 1 is a schematic drawing for explaining lens astigmatism in a scanning electron microscope.

As shown in FIG. 1, the main cause of astigmatism is due to the fact that the focal length of the electron lens diverges at right angles in two different directions. In the figure, by assuming that the intersecting point of the x and y passes through the principal plane of the lens, a focal line C is formed in the x-direction focal plane, a focal line E is formed in the y-direction focal plane, and midway between C and E lies the circle of least confusion D. The circle of least confusion D corresponds to the optimum focus position when astigmatism is corrected. The distance $\Delta F$ separating C and E is known as the astigmatic difference.

Figure 2A:
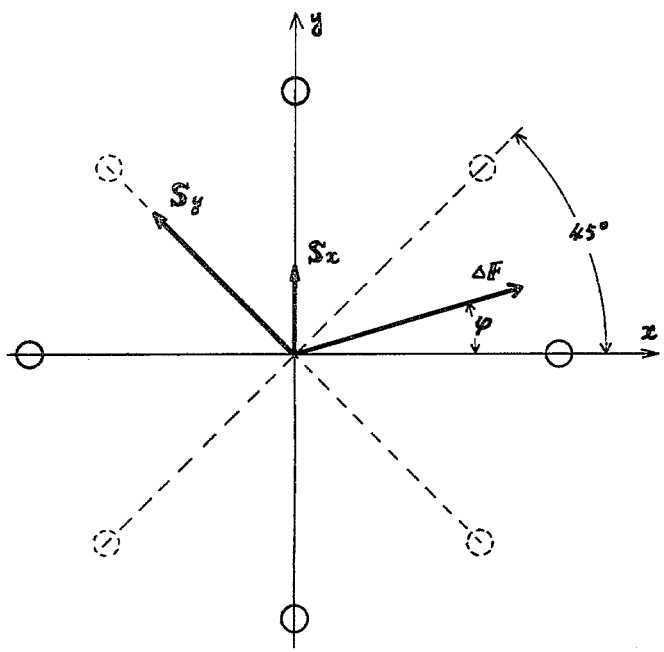
FIGS. 2(a), 2(b), and 2(c) are schematic drawings for explaining the relation between lens astigmatism and the stigmator.
Figure 2B:
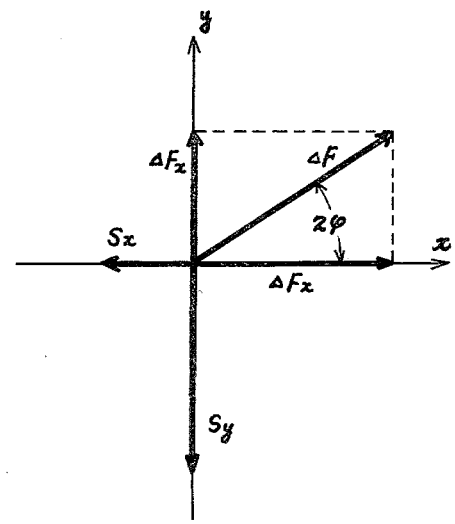

Now let us consider correcting lens astigmatism by deviating vector $\Delta F$ from the X-axis by angle $\phi$ with aid of an 8 pole (2 pair) electromagnetic stigmator, commonly referred to as an xy type stigmator, as shown in FIG. 2. $S_x$, in the figure, represents the astigmatism correction vector produced by a 4 pole lens (indicated by O) arranged on the x and y axes, and $S_y$ represents the astigmatism correction vector produced by another 4 pole lens (indicated by ◌ ) arranged equidistantly between x and y axes. Furthermore, in order to more readily perceive the relation between the vectors, the angles of divergence have been doubled as shown by $\Delta F$, $S_x$ and $S_y$ in FIG. 2(b).

In FIG. 2(b), $\Delta F$ is resolved into xy components $\Delta F_x$ and $\Delta F_y$. Accordingly, $\Delta F$ can be written as follows.

$$\Delta F = \sqrt{\Delta F_x^2 + \Delta F_y^2}$$

Furthermore, the diameter $\delta$ of the circle of least confusion is proportional to the astigmatic difference. Hence, $$\delta = k \cdot \Delta F \tag{1}$$

where k is a coefficient relating to the angle of divergence of the electron beam.

Figure 2C:
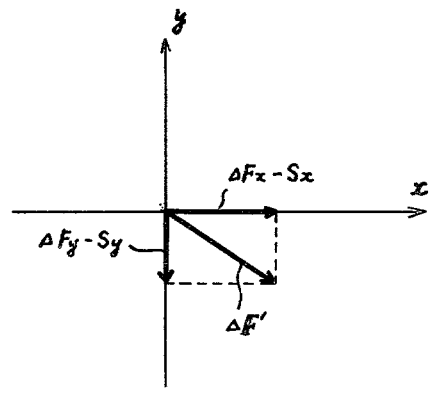

The resultant astigmatism vector when the stigmator is activated is $\Delta F'$ as shown in FIG. 2(c) and the astigmatic difference $\Delta F'$ corresponding to $\Delta F'$ is given as follows.

$$\Delta F' = \sqrt{(\Delta F_x - S_x)^2 + (\Delta F_y - S_y)^2} \tag{2}$$

Accordingly, it is known from equation (1) that the size of the circle of least confusion $\delta'$, at this time, is as follows:

$$\delta' = k \sqrt{(\Delta F_x - S_x)^2 + (\Delta F_y - S_y)^2} \tag{3}$$

Thus, if $\delta'$ is kept at a minimum value by successively and independently operating the two 4 pole lenses constituting the stigmator, $\Delta F' \rightarrow 0$. Concomitantly, $\delta' \rightarrow 0$, thereby enabling lens astigmatism to be fully corrected.

The general principle of the subject invention is as described above. However, the actual procedure used for correcting lens astigmatism is as follows:

(a) zeroing the stigmator compensating current, (b) varying the lens current while the lens is still under the influence of astigmatic aberration, (c) shaping the electron beam irradiating the specimen surface so as to accord with the circle of least confusion, (d) locking the lens current under the condition of circle of least confusion, and (e) independently and automatically adjusting the compensating current in the x and y direction coils, constituting the xy type stigmator, (by a means similar to the automatic focusing means as described in U.S. Pat. No. 3,937,959), so as to reduce the size of the circle of least confusion.

Figure 3:
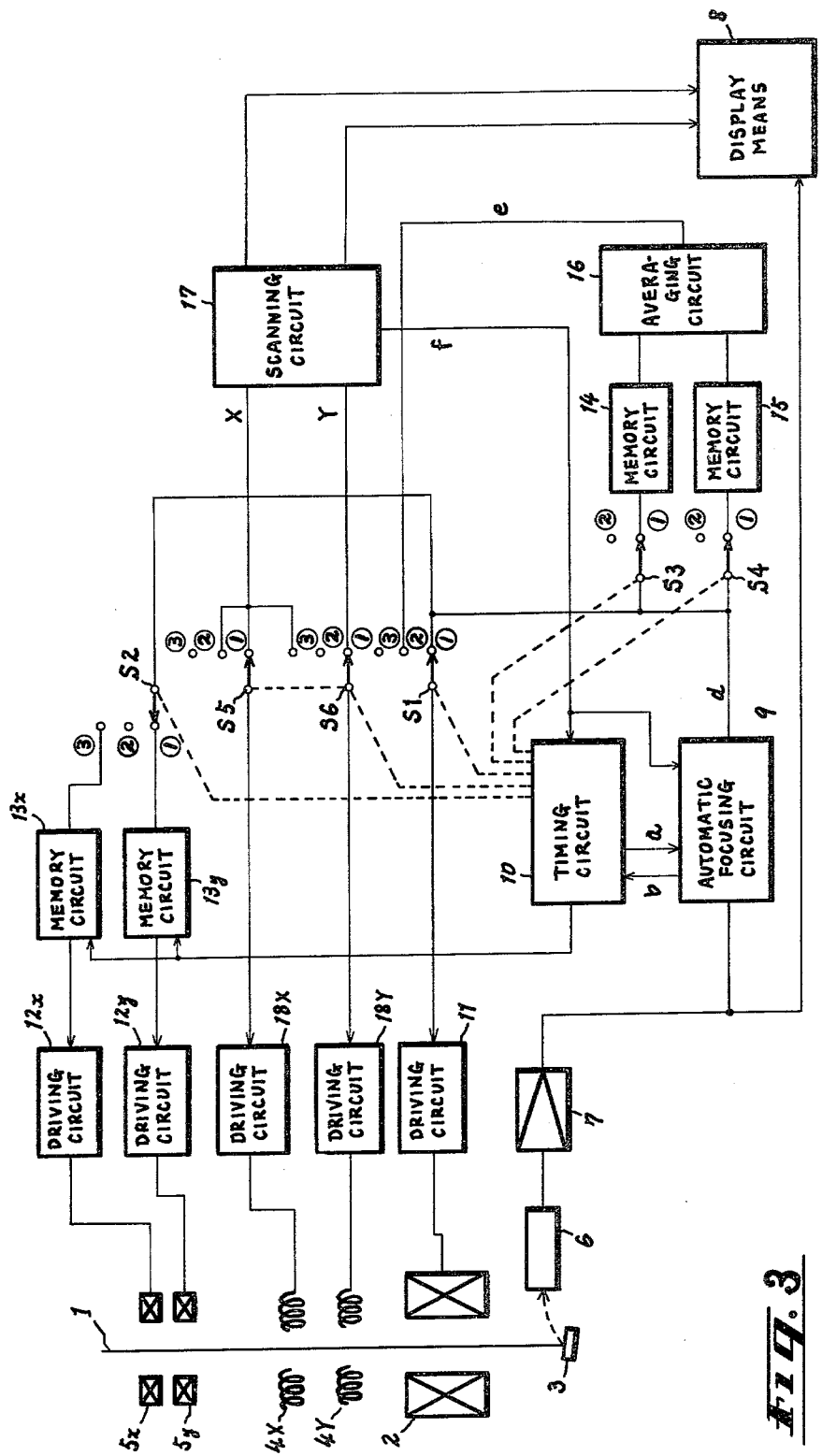
FIG. 3 is a block schematic showing one embodiment according to this invention.

FIG. 3 shows one embodiment of an automatic stigmator according to the subject invention. In the figure, an electron beam 1 is generated by an electron gun (not shown), a focusing (condenser or objective) lens 2 finely focuses said electron beam 1 on a specimen 3. Deflecting coils 4X and 4Y scan said finely focused electron beam 1 on said specimen 3 two dimensionally, and stigmator coils 5X and 5Y correct astigmatism in the x and y directions, respectively. The X and Y directions of the deflecting coils and x and y directions of the stigmator coils are determined freely and independently. Secondary electrons, backscattered electrons, etc. (constituting information appertaining to the specimen) which are emitted from the specimen concomitant with electron beam irradiation, are detected by a detector 6, and the obtained detection signal is fed into a display means 8 and an automatic focusing circuit 9 via an amplifier 7. The automatic focusing circuit 9 is brought into operation by a start signal 'a' from a timing circuit 10; moreover, when circuit 9 has completed its focusing operation, it sends a stop signal 'b' to the timing circuit 10 in order to terminate operation of the circuit 9. During operation, the automatic focusing circuit 9 generates an excitation current designating signal 'd' which is fed to a focusing lens driving circuit 11 via a switching circuit S1, and to stigmator coil driving circuits 12x and 12y via switching circuit S2 and memory circuits 13x and 13y. Memory circuits 14 and 15 receive the excitation current designating signal 'd' via switching circuits S3 and S4, respectively so as to memorize the value of signal 'd' at the completion of the focusing operation of the automatic focusing circuit 9. An averaging circuit 16 obtains the average value 'e' of the signal 'd' memorized by memory circuits 14 and 15, said averaged signal 'e' being fed to the focusing lens driving circuit 11 via the switching circuit S1 so as to supply excitation current having a circle of least confusion to the focusing lens 2. A scanning circuit 17 supplies X and Y scanning signals to deflection coil driving circuits 18X and 18Y via switching circuit S5 and S6, respectively. It is also possible to supply the X scanning signal to the deflection coil driving circuit 18Y via switching circuit S6. Moreover, the scanning circuit 17 generates a signal 'f' which is synchronized with the X scanning signal, said signal 'f' being supplied to the timing circuit 10 and the automatic focusing circuit 9. Accordingly, the timing circuit 10 operates, through the medium of synchronous signal 'f' and stop 'b', so as to control the switchover of switching circuits S1~S6 in accordance with a predetermined sequence.

Figure 4:
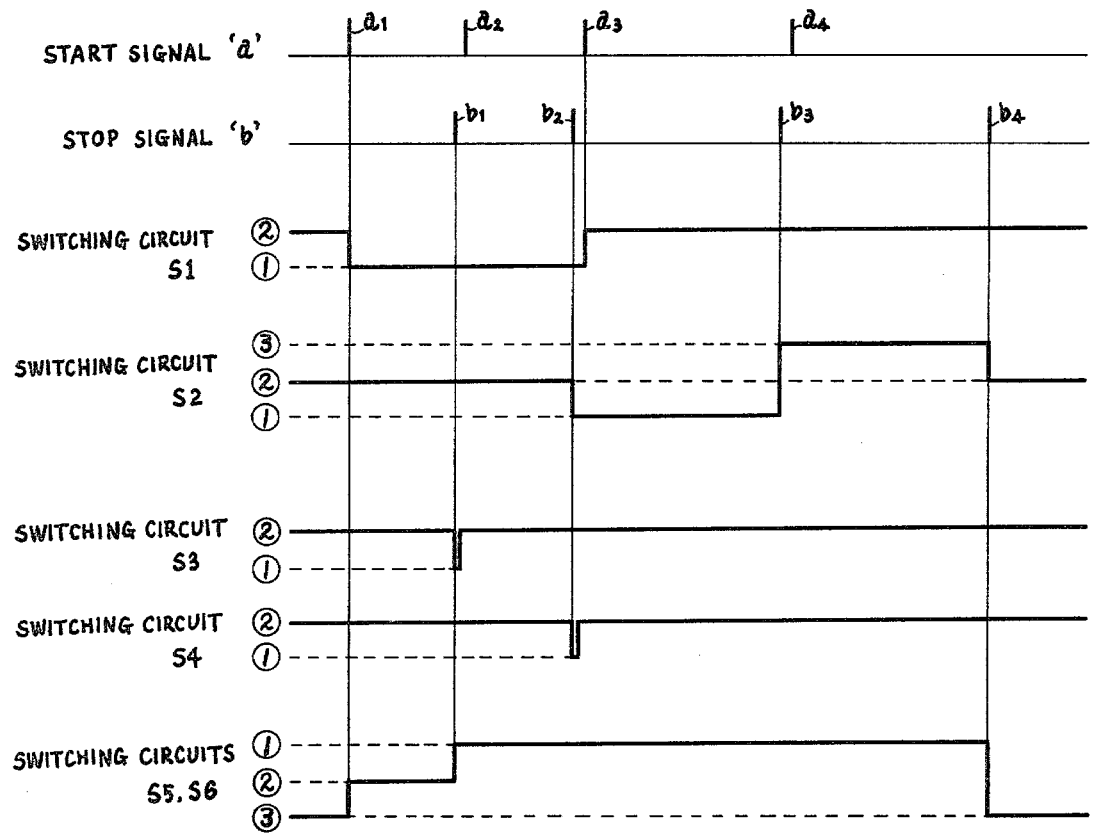
FIG. 4 is a schematic diagram for explaining the operation of the embodiment shown in FIG. 3.

The following describes in detail the operation of the timing circuit in the embodiment heretofore described, in conjunction with FIG. 4.

Placing the Focal Length at the Circle of Least Confusion by Adjusting the Objective Lens First of all, when the timing circuit is activated, start signal 'a₁' is supplied to the automatic focusing circuits 9, S1 is positioned at ①, and S5 and S6 are positioned at ②. Accordingly, the electron beam 1 scans or sweeps the specimen 3 repeatedly in the X-direction and the excitation current flowing through the focusing lens 2 is varied by the automatic focusing circuit 9 as disclosed in U.S. Pat. No. 3,937,959. That is to say, as each scan is completed, the excitation current is varied progressively in stepwise fashion. Meanwhile, the amount of detection signal variation concomitant with each scan is accumulated and used as a conversion signal corresponding to the diameter of the electron beam in the X-direction. Pairs of conversion signals are successively compared until a signal of maximum intensity is obtained; at which point the excitation current is locked. By so doing, the excitation current is locked at a value where the electron beam diameter in the X-direction is the smallest.

Figure 5:
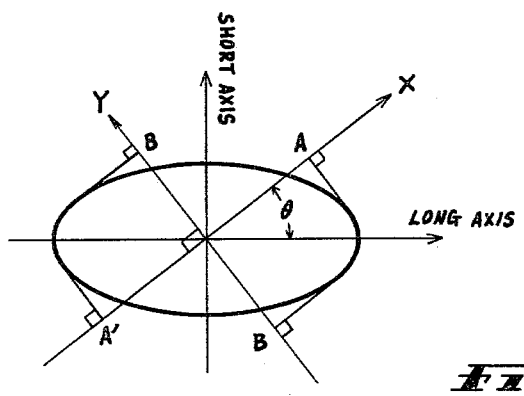
FIG. 5 is a schematic drawing showing a cross-section of an electron beam influenced by lens astigmatism.

When the above focusing operation is carried out, S2 is positioned at ②, and memory circuits 13x and 13y are cleared by clearing pulse C outputted from timing circuit 10. Accordingly, since stigmator coils 5x and 5y are out of operation, astigmatism correction is suspended. As a result, if the angle between the long axis of the ellipse attributable to astigmatism, and the scanning direction X is, let us say, $\theta$ as shown in FIG. 5, the conversion signal will reach maximum intensity when the diameter of the ellipse in the scanning direction X is minimum ($\overline{AA'}$, in FIG. 5), because, at this point, the detection signal exhibits its most marked variation. Accordingly, if the automatic focusing circuit 9 varies the excitation current of the focusing lens gradually stepwise, the shape of the electron beam will vary as shown in FIG. 1 from F→C→G→D→H→I. That is to say, the minimum value $\overline{AA'}$ will lie somewhere between the focus line C and the circle of least confusion D, at position G, for example; at which position, the automatic focusing circuit 9 generates a stop signal 'b₁' at an excitation current I₁, thereby terminating the focusing operation.

Meanwhile, the timing circuit 10, through the medium of said stop signal 'b₁', positions switching circuit S3 at ① for a short period of time; during which time, an excitation current designation signal K1, having the same value as I1, is memorized by memory circuit 14.

Now, by positioning switching circuits S5 and S6 at ③, the electron beam is made to scan the specimen in the Y-direction and, with S5 and S6 positioned thus, the timing circuit 10 sends a start signal 'a₂' to the automatic focusing circuit 9 in order to effect focusing in the Y-direction of the electron beam scan. The focusing sequence in the X-direction is identical to that in the Y-direction. That is, in the case of X-direction focusing, the automatic focusing circuit 9 generates a stop signal B₂ (at an excitation current I2), at position H in FIG. 1 (minimum value $\overline{BB'}$, see FIG. 5) which lies somewhere between the focus line E and the circle of least confusion D, thereby terminating the focusing operation. Meanwhile, the timing circuit 10, in accordance with the stop signal B₂, positions switching circuit S4 at ① for a short period of time; during which time, an excitation current designation signal K2 having the same value as I2, is memorized by memory circuit 15, etc. By thus feeding signals K1 and K2 into memory circuits 14 and 15, respectively, the timing circuit 10 positions S1 at ② and the output signal $e = K1 + K2/2$ from the averaging circuit 16 accordingly enters the focusing lens driving circuit 11. Thus, the focusing lens excitation current becomes $I1 + I2/2$ and the specimen 3 is irradiated by the electron beam under the condition whereby the circle of least confusion D lies exactly midway between G and H in FIG. 1.

Astigmatism Correction with the XY Type Stigmator

While maintaining the focusing lens excitation current at $I1 + I2/2$, astigmatism correction is carried out. That is to say, by sending a start signal 'a₃' to the automatic focusing circuit 9 and having the timing circuit 10 operate so as to position S2 at ①, the electron beam scans the specimen in the Y-direction and the stigmator coil 5y is activated. The focusing circuit 9, in the same way as in the case of the above described focusing operation, varies the current flowing through the stigmator coil 5y progressively in stepwise fashion at the completion of each Y-direction scan of the electron beam. Meanwhile, the amount of detection signal variation concomitant with each scan is accumulated and used as a conversion signal indicative of the electron beam diameter in the Y-direction. Pairs of conversion signals are successively compared until a signal of maximum intensity is obtained, at which point, the excitation current I3 flowing through the stigmator coil 5y is locked. By so doing, the excitation current is locked at a value where the electron beam diameter in the Y-direction is the smallest. The excitation current I3 is held by memory circuit 13y even though the switching circuit S2 is changed. The above operation corresponds to shifting the focal line E towards the circle of the least confusion D in FIG. 1. Furthermore, by means of this operation, the Y-direction diameter of the electron beam formed on the specimen becomes minimum.

After receiving step signal 'b3' indicative of completion of adjustment of x-direction stigmator coil current I3, the timing circuit 10 operates so as to start x-direction stigmator coil adjustment by positioning S2 at ③ and sending a start signal 'a4' to the automatic focusing circuit 9. The focusing circuit 9, in the same way as in the case of the above described y-direction stigmator coil adjustment, determined and locks the excitation current I4 flowing through the stigmator coil 5x so as to form the minimum X-direction diameter of the electron beam on the specimen. By so doing, when stop signal 'b4' indicative of completion for adjustment of the y-direction stigmator coil current is generated, the cross-section of the electron beam formed on the specimen becomes circular, said circle having minimum diameter. Namely, the electron beam is not influenced by the astigmatism of the focusing lens system. When the stop signal 'b4' is inputed, the timing circuit 10 positions S5 and S6 at ① so that the electron beam scans the specimen two-dimensionally. As a result, a high quality scanning image is displayed on the screen of the display means in synchronism with said electron beam scanning.

Additionally, it is preferable to repeat the above mentioned x and y direction stigmator adjustment alternately.

There are other comparatively simple methods for precisely determining the focusing lens current so that the circle of least confusion of the electron beam is formed on the specimen. For example, instead of repetitively scanning the electron beam linearly, repetitive circular scanning is feasible. Another simple method would be to manually adjust the focusing lens current while observing the scanning image on a conventional scanning image display means.

Having thus described our invention with the detail and particularity required by the Patent Laws, what is desired protected by Letters Patent is set forth in the following claims.

We claim:

1. A method for automatically correcting astigmatism in a scanning electron microscope or the like having a focusing lens system for focusing the electron beam on a specimen, and an xy type electromagnetic stigmator for correcting the astigmastism of said focusing lens system, said method comprising:
   (a) a step for scanning the electron beam repeatedly on the specimen,
   (b) a step for successively and independently changing the excitation current flowing through the x and y direction coils constituting the xy type stigmator,
   (c) a step for converting the signal emanating from the specimen into a signal indicative of the electron beam diameter in the scanning direction during each scan, and
   (d) a step for locking the excitation current flowing through the x and y direction coils when the conversion signal reaches a value indicative of the minimum beam diameter.

2. A method for automatically correcting astigmatism in a scanning electron microscope or the like having a focusing lens system for focusing the electron beam on a specimen, and an xy type electromagnetic stigmator for correcting the astigmatism of said focusing lens system, said method comprising:
   (a) a first step for adjusting and locking the focusing lens system so that a circle of least confusion of the electron beam is formed on the specimen without operation of said stigmator, and
   (b) a second step for automatically adjusting said stigmator under the condition as established by step (a) so as to obtain an electron beam having the smallest possible diameter.

3. A method according to claim 2, said second step (b) comprising:
   (b-1) a step for scanning the electron beam repeatedly on the specimen,
   (b-2) a step for sequentially changing the excitation current flowing through the x and y direction coils constituting the xy type stigmator,
   (b-3) a step for converting the signal emanating from the specimen into a signal indicative of the electron beam diameter in the scanning direction during each scan, and
   (b-4) a step for locking the excitation current flowing through the x and y direction coils when the conversion signal reaches a value indicative of the minimum beam diameter.

4. A method according to claim 2, said first step (a) comprising:
   (a-1) a step for scanning the specimen repeatedly in at least two different directions,
   (a-2) a step for converting the signal emanating from the specimen into a signal indicative of the electron beam diameter in each different direction during each scan,
   (a-3) a step for determining the focusing lens current values of said focusing lens system corresponding to the minimum diameters of the electron beam in the different directions in accordance with said conversion signal, and
   (a-4) a step for calculating the focusing current value corresponding to the circle of least confusion of the electron beam on the specimen surface from the focusing current values determined by said step (a-3).

5. An electron beam scanning device comprising:
   (a) a focusing lens system for focusing the electron beam on a specimen,
   (b) an xy type stigmator for correcting the astigmatism of said focusing lens system,
   (c) a scanning means for scanning the electron beam repeatedly on the specimen,
   (d) a means for automatically adjusting the focusing lens system to place the focal length at the circle of least confusion,
   (e) a converting means for converting the signal emanating from the specimen concomitant with electron beam irradiation into a signal indicative of the electron beam diameter in the scanning direction during each scan, and
   (f) a means for automatically adjusting the excitation current flowing through said stigmator, under the condition of the circle of least confusion of the electron beam in accordance with said conversion signal so that the diameter of the electron beam irradiating the specimen is minimal.

6. An electron beam scanning device comprising:
(a) a focusing lens system for focusing the electron beam on a specimen,
(b) an xy type stigmator for correcting the astigmatism of said focusing lens system,
(c) a scanning means for scanning the electron beam repeatedly on the specimen,
(d) a converting means for converting the signal emanating from the specimen concomitant with electron beam irradiation into a signal indicative of the electron beam diameter in the scanning direction during each scan,
(e) a means for automatically determining the focusing current value, at which a circle of least confusion of the electron beam is formed on the specimen in accordance with said conversion signal, and
(f) a means for automatically adjusting the excitation current flowing through said stigmator, under the condition of the circle of least confusion of the electron beam in accordance with said conversion signal so that the diameter of the electron beam irradiating the specimen is minimal.

7. An electron beam scanning device according to claim 6, in which said means (e) for automatically determining the focusing current value is initially activated without operation of said stigmator.

* * * * *